United States Patent
Paek et al.

(10) Patent No.: US 6,169,413 B1
(45) Date of Patent: Jan. 2, 2001

(54) SYSTEM FOR TESTING HARD DISK DRIVES

(75) Inventors: Woon-Juk Paek, Kwangmyeong; Jeong-Min Kang; Dae-Geun Ryoo, both of Seoul; Young-Bok Sung, Kyungsangbuk-do; Chang-Woo Nam, Gumi, all of (KR)

(73) Assignee: SamSung Electronics Co., Ltd., Suwon (KR)

( * ) Notice: Under 35 U.S.C. 154(b), the term of this patent shall be extended for 0 days.

(21) Appl. No.: 08/854,723

(22) Filed: May 12, 1997

(30) Foreign Application Priority Data

May 11, 1996 (KR) .................................................. 96-15692
Nov. 13, 1996 (KR) .................................................. 96-53789
Apr. 22, 1997 (KR) .................................................. 97-14867

(51) Int. Cl.⁷ .................................................. G01R 31/02
(52) U.S. Cl. ........................................ 324/760; 324/158.1
(58) Field of Search ................................ 324/158.1, 760, 324/73.1

(56) References Cited

U.S. PATENT DOCUMENTS

| 4,636,726 | 1/1987 | Santomango et al. . |
|---|---|---|
| 4,683,424 | 7/1987 | Cutright et al. . |
| 4,746,995 | 5/1988 | Rauskolb . |
| 4,888,549 | 12/1989 | Wilson et al. . |
| 4,967,155 | 10/1990 | Magnuson . |
| 5,126,656 | 6/1992 | Jones . |
| 5,223,006 | 6/1993 | Moran, III . |
| 5,333,140 | 7/1994 | Moraru et al. . |
| 5,397,998 | 3/1995 | Soeno et al. . |
| 5,537,537 | 7/1996 | Fujikawa et al. . |
| 5,644,705 | * 7/1997 | Stanley .................................... 714/42 |
| 5,851,143 | * 12/1998 | Hamid .................................... 454/57 |

* cited by examiner

Primary Examiner—Ernest Karlsen
(74) Attorney, Agent, or Firm—Robert E. Bushnell, Esq.

(57) ABSTRACT

A system for multi-testing a number of hard disk drives (HDDs) comprises a burn-in chamber of high temperature for orderly stacking the HDDs in rows and columns, a control chamber thermally insulated from the burn-in chamber by a partition wall for detachably mounting a plurality of HDD test computers in rows and columns electrically connected with the HDDs with each HDD test computer testing corresponding ones of said HDDs, and a host computer for controlling an internal environment of the burn-in chamber and operation of the HDD test computers.

65 Claims, 12 Drawing Sheets

SYSTEM FOR TESTING HARD DISK DRIVES

CLAIM FOR PRIORITY

This application makes reference to, incorporates the same herein, and claims all benefits accruing under 35 U.S.C. §119 from an application for SYSTEM FOR TESTING HARD DISK DRIVES earlier filed in the Korean Industrial Property Office on May 10, 1996, Nov. 13, 1996, and Apr. 22, 1997, and there duly assigned Ser. Nos. 96-15692 and 96-53789.

BACKGROUND OF THE INVENTION

1. Technical Field

The present invention relates to a system for testing hard disk drives (HDDs), and more particularly, relates to a system for multi-testing a number of HDDs by using a single host computer connected to a plurality of HDD test computers.

2. Related Art

In last several decades, rapid innovation in the hard disk drive technology has been parallel with the progress in the VLSI and software techniques to serve as a traction engine for the development of the modem information industry. The trend of hard disk drive (HDD) technology is directed toward miniaturization, and maximization of storage capacity that has increased almost by ten times in terms of the recording density for every decade.

In order to test the performance of the HDDs during the post-manufacturing process before shipping to distributors, the HDDs need to be tested for servo-writing, functional test, burn-in test, and final test for checking whether the testing sets of HDDs have passed through the burn-in process after being subjected to the precise defect identifying and neutralizing process. The burn-in process requires the longest time (usually 8–16 hours) in the course of manufacturing HDDs, and the burn-in test is performed on the racks in a burn-in chamber by the self-program without a separate test system. The bum-in process is intended to identify defects on the disks and to prearrange the defects to be skipped when using HDDs.

Conventional HDD test system generally requires a single test computer to perform various tests on a corresponding one of HDDs connected thereto in a one-to-one relationship. Examples of HDD test systems are disclosed in U.S. Pat. No. 4,636,726 for Electronic Burn-In System issued to Santomango et al., U.S. Pat. No. 4,683,424 for Apparatus For Use In Testing Circuit Boards issued to Cutright et al., U.S. Pat. No. 4,888,549 for System For Testing Individually A Plurality Of Disk Drive Units issued to Wilson et al., and U.S. Pat. No. 4,976,155 for Environmentally Controlled Media Defect Detection System For Winchester Disk Drives issued to Magnuson. If two HDDs were, in theory, to be electrically connected with a single test computer, one of two HDDs as connected serves as a master and the other HDD serves as a slave to the test computer, and only one HDD can be tested at a time. The HDD test system is generally constructed so that each HDD test computer and its corresponding HDD are properly positioned in a test chamber of high temperature for testing purposes. Such conventional HDD testing system, as we have observed however, has a number of drawbacks. First, the conventional HDD testing system requires the same number of test computers as the HDDs to be tested at a time because there is a one-to-one connection structure between the test computers and the HDDs. As a result, the testing system becomes bulky and cost prohibitive due to the large number of HDD test computers required for testing the HDDs. Second, the conventional HDD testing system is limited in performance because the number of HDDs tested simultaneously is limited. Third, the conventional HDD testing system is not reliable in terms of its testing result because the test is often performed by separate test equipments. Fourth, the conventional HDD testing system often fails to regulate the high testing chamber and, and as a result, is unable to protect the HDD test computers installed therein from operational damage.

SUMMARY OF THE INVENTION

Accordingly, it is an object of the present invention to provide a system for multi-testing a number of HDDs using a single host computer having a monitor incorporated therein.

It is also an object to provide a system for multi-testing a number of HDDs using a single host computer, to control a plurality of HDD test computers each coupled to a corresponding pair of HDDs for testing the corresponding pair of the HDDs.

It is another object to provide a system for multi-testing the reliability of a number of HDDs in a controlled environment of high temperature.

These and other objects of the present invention can be achieved by a system for multi-testing a number of hard disk drives (HDDs) which comprises a burn-in chamber of high temperature for orderly stacking the HDDs in rows and columns, a control chamber thermally insulated from the burn-in chamber by a partition wall for detachably mounting a plurality of HDD test computers in rows and columns to electrically connect with the HDDs, and a host computer for controlling an internal environment of the burn-in chamber and operation of the HDD test computers.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
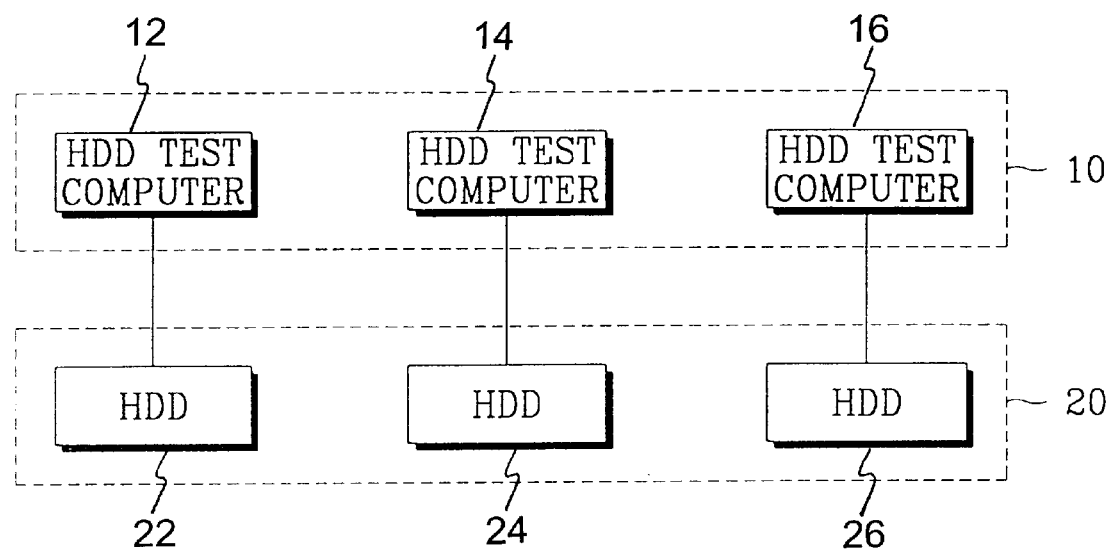
FIG. 1 illustrates a contemporary architecture of a HDD test system.

Reference now made to the drawings and particularly to FIG. 1, which illustrates a contemporary HDD test system including a test computer section 10 and a HDD section 20. The test computer section 10 contains a plurality of HDD test computers 12, 14, 16 each connected to a corresponding one of HDDs 22, 24, 26 contained in the HDD section 20. Each test computer is used to perform various tests on a corresponding one of HDDs connected thereto in a one-to-one relationship. When the HDD test system performs tests on two HDDs with a single test computer, for example, one of two HDDs as connected to the single test computer serves as a master and the other HDD serves as a slave to the test computer, and only one HDD can be tested at a time.

Contemporary HDD test system, as we have noted earlier, has a number of drawbacks. First, the HDD testing system requires the same number of test computers as the HDDs to be tested at a time because there is a one-to-one connection structure between the test computers and the HDDs. As a result, the testing system becomes bulky and cost prohibitive due to the large number of HDD test computers required for testing the HDDs. Second, the HDD testing system is limited in performance because the number of HDDs tested simultaneously is limited. Third, the HDD testing system is not reliable in terms of its testing result because the test is often performed by separate test equipments. Fourth, the HDD testing system often fails to regulate the high testing chamber, and as a result, is unable to protect the HDD test computers installed therein from operational damage.

Figure 2:
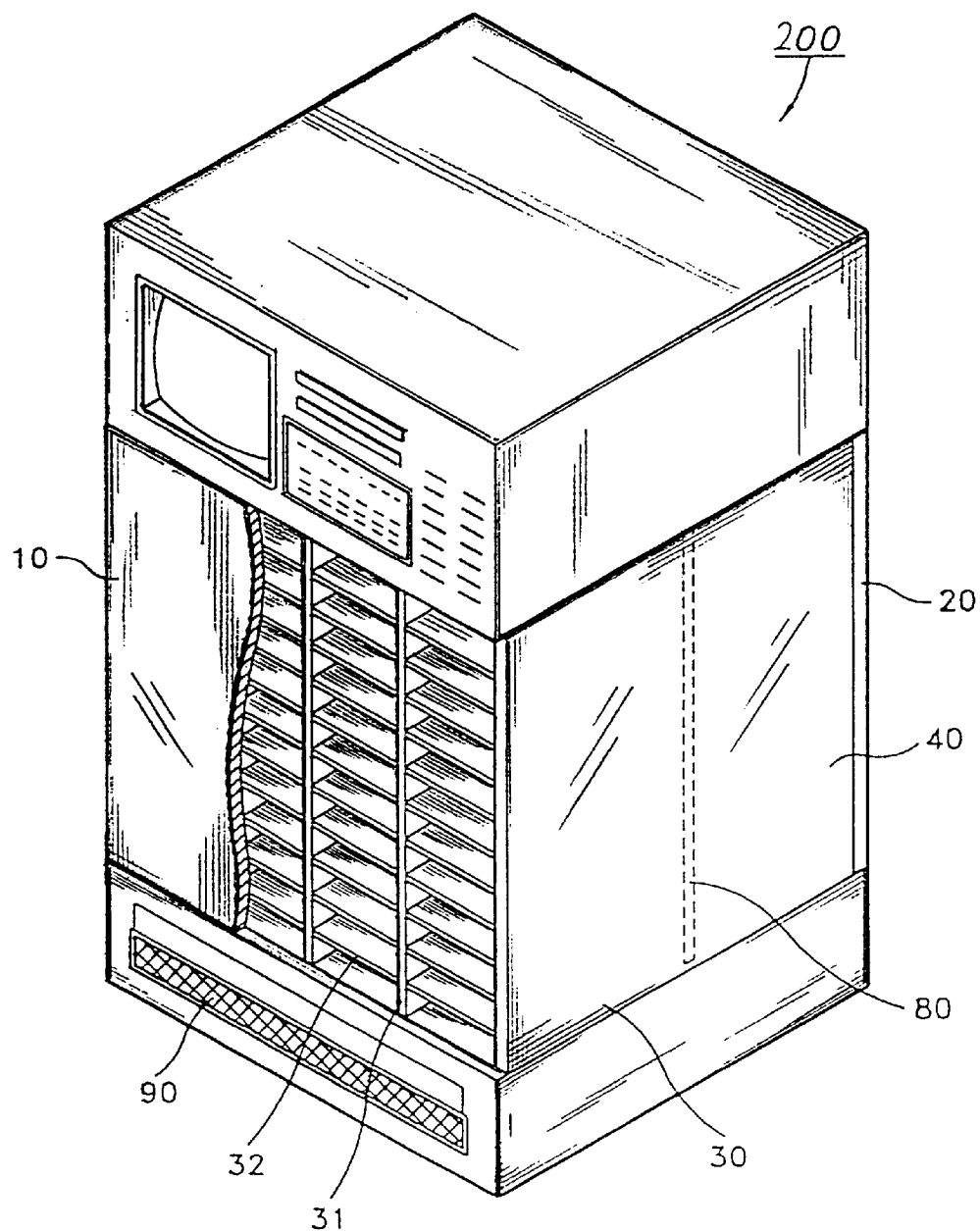
FIG. 2 is a perspective front view of a HDD test system for testing HDDs constructed according to a preferred embodiment of the present invention.
Figure 3:
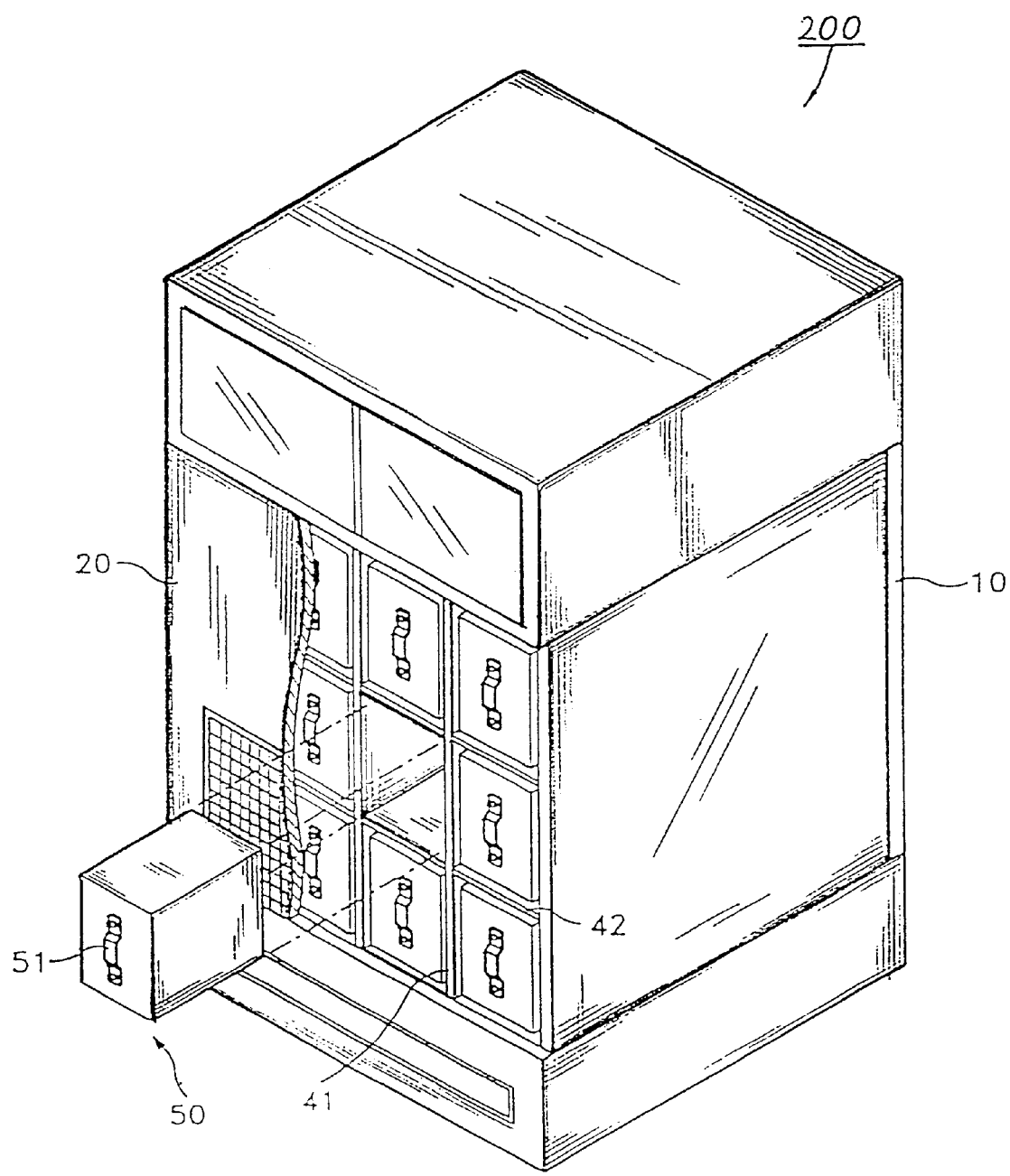
FIG. 3 is a perspective rear view of a HDD test system for testing HDDs constructed according to the preferred embodiment of the present invention.

FIGS. 2 and 3, which illustrate a HDD test system for testing HDDs constructed according to the principles of the present invention. From the front view as shown in FIG. 2, the HDD test system 200 has an integrated testing body including a front panel 10, a back panel 20, a high temperature burn-in chamber 30 accessible from the front panel 10 in which a plurality of HDDs are optimally stacked in rows and columns in order to be efficiently tested by corresponding HDD test computers 50, and a control chamber 40 accessible from the back panel 20 in which a plurality of test computers 50 are arranged in corresponding rows and columns with each test computer electrically connected to corresponding ones of HDDs stacked in rows and columns supported by supporting racks 31 and receptacles 32. The HDD test system also has a visual display or monitor 210 located at an upper portion of the front panel 10 of the integrated testing body that serves to provide visual indication of testing of individual HDD, and a plurality of perforated air intakes 90 located at a lower portion of the front panel 10 of the integrated testing body.

From the rear view as shown in FIG. 3, the HDD test system contains a plurality of individual HDD test computers 50 arranged in corresponding rows and columns supported by corresponding supporting racks 41 and receptacles 42. Each test computer 50 has a handle 51 for facilitating its removal and replacement if necessary.

Figure 4:
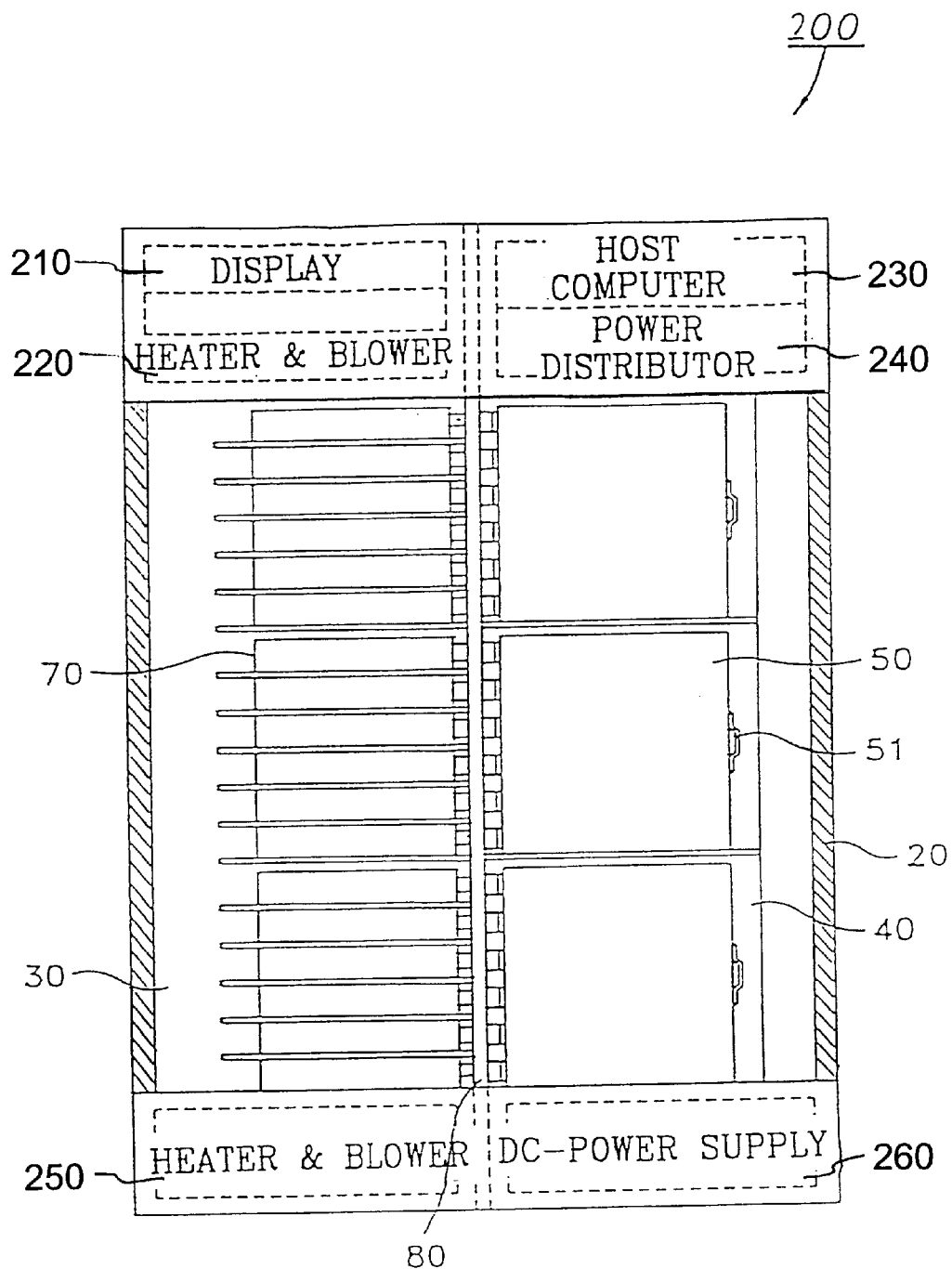
FIG. 4 is a side elevation view of an internal construction of the HDD test system for testing HDDs constructed according to the preferred embodiment of the present invention.

FIG. 4 illustrates an internal construction of the HDD test system for testing HDDs as constructed according to the preferred embodiment of the present invention. A host computer 230 is positioned above the control chamber 40 in order to control the internal environment, i.e., temperature and humidity of the burn-in chamber 30, and to generate and apply start signals to the HDD test computers 50. Air intake 90 is provided at the lower portion of the system's front panel 10 with heater and blower (including air filters and air outlets) 250, and DC power supply 260 is provided at the lower portion of the system's rear panel 20. In order to mount HDDs in rows and columns, a plurality of HDD mounting jigs 70 are fixed in the burn-in chamber 30 by means of hollow supporting racks 31 and receptacles 32. A monitor 210 is installed at the upper portion of the system's front panel 10, whereby test results of the control chamber 40 can be easily checked, and a keyboard for inputting instructions is arranged adjacent the monitor 210. Further, a voltage indicator from power distributor 240 is also provided on the upper portion of the system, so that the operator can check the power supply.

Figure 5:
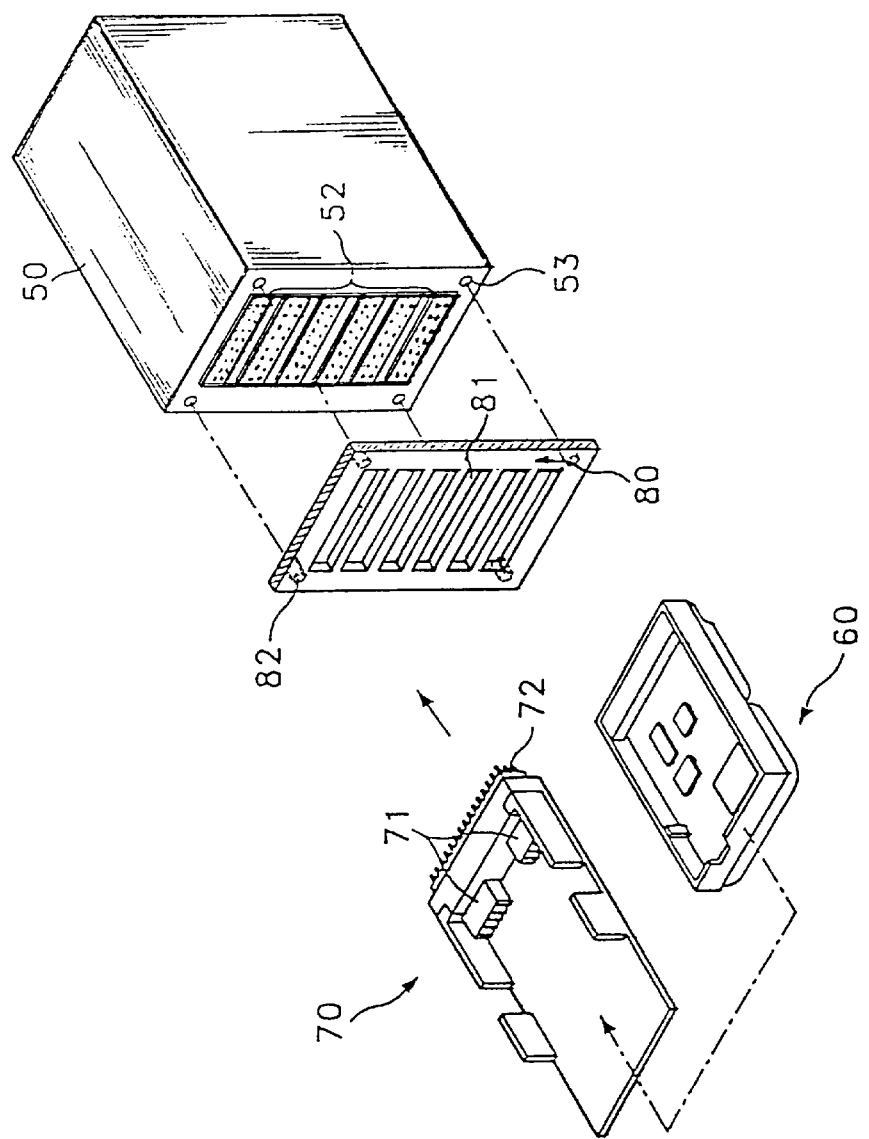
FIG. 5 is an exploded perspective view of a plurality of HDDs connected with a HDD test computer according to the principles of the present invention.

Referring to FIGS. 4 and 5, the burn-in chamber 30 and the control chamber 40 are divided by the partition wall 80. The burn-in chamber 30 provides a test environment for testing the high temperature reliability of HDDs 60. The structure of the burn-in chamber 30 is designed to detachably mount HDDs when loading and unloading for reliability test. A plurality of HDDs 60 are stacked in rows and columns within the burn-in chamber 30 and connected with a single HDD test computer 50 in the control chamber 40. Likewise, the HDD test computers 50 in the control chamber 40 are connected with a plurality of HDDs 60, so that a number of HDDs 60 can be simultaneously and efficiently tested within an optimum space.

The HDDs 60 are first placed onto the respective mounting jigs 70 which in turn are inserted together with HDDs 60 into the burn-in chamber 30 and electrically connected with the HDD test computers 50. The HDD mounting jigs 70 are provided internally with pogo pins 71 and outwardly with intermediate connectors 72, both being electrically connected with each other, whereby the pogo pins 71 are electrically connected with power pins and signal pins of the connector of HDDs 60 when the HDDs are placed onto the HDD mounting jigs 70. The intermediate connectors 72 are passed through the slots 81 provided on the partition wall 80 to be connected with the test connectors 52.

FIG. 5 illustrates a HDD test unit in which a single HDD test computer 50 can simultaneously test six HDDs 60. Namely, a HDD test computer 50 has six test connectors 52 stacked from top to bottom, and the corresponding six slots 81 are provided on the partition wall 80 for mounting and testing six HDDs 60 simultaneously. Additionally, the partition wall 80 is provided with a plurality of guide pins 82 formed on the side toward the control chamber 40, and the HDD test computer 50 is provided with corresponding guide holes 53 formed on the side toward the partition wall 80 so that the HDD test computer 50 is correctly positioned against the partition wall 80.

As shown in FIG. 4, the HDD test system 200 has heaters with blowers 220 and 250 on the top and bottom, respectively, to heat the burn-in chamber 30 with high temperature and maintain the burn-in chamber 30 at a proper temperature. The host computer 230 is installed at the upper portion of the control chamber 40 to control the internal environment of the burn-in chamber 30 and to generate control signals for the HDD test computers 50 of the control chamber 40, and a DC power supply 260 and a power distributor 240 are provided under and above, respectively the host computer 50 to efficiently supply power to the system.

Each HDD test computer 50 is detachably installed in the control chamber 40 and provided with a handle 51 for easily pulling out for the maintenance work. The HDD test computer 50 comprises a power supply, a mainboard, and a plurality of test connectors 52 arranged vertically to be connected with HDDs 60. Accordingly, the HDD test computers 50 can be efficiently and easily maintained for repairing and replacement purposes.

As mentioned above, the HDDs 60 each are placed on the respective HDD mounting jigs 70 provided within the burn-in chamber 30, whereby the HDDs 60 are connected to the pogo pins 71 of the HDD mounting jigs 70 which are in turn connected to the test connectors 52 of the HDD test computer 50 by means of the intermediate connectors 72, whereby the intermediate connectors 72 passed through the slots 81 to be connected with the HDD test computer 50, which consequently guarantees the precise and convenient performance test of the HDDs 60.

Figure 6:
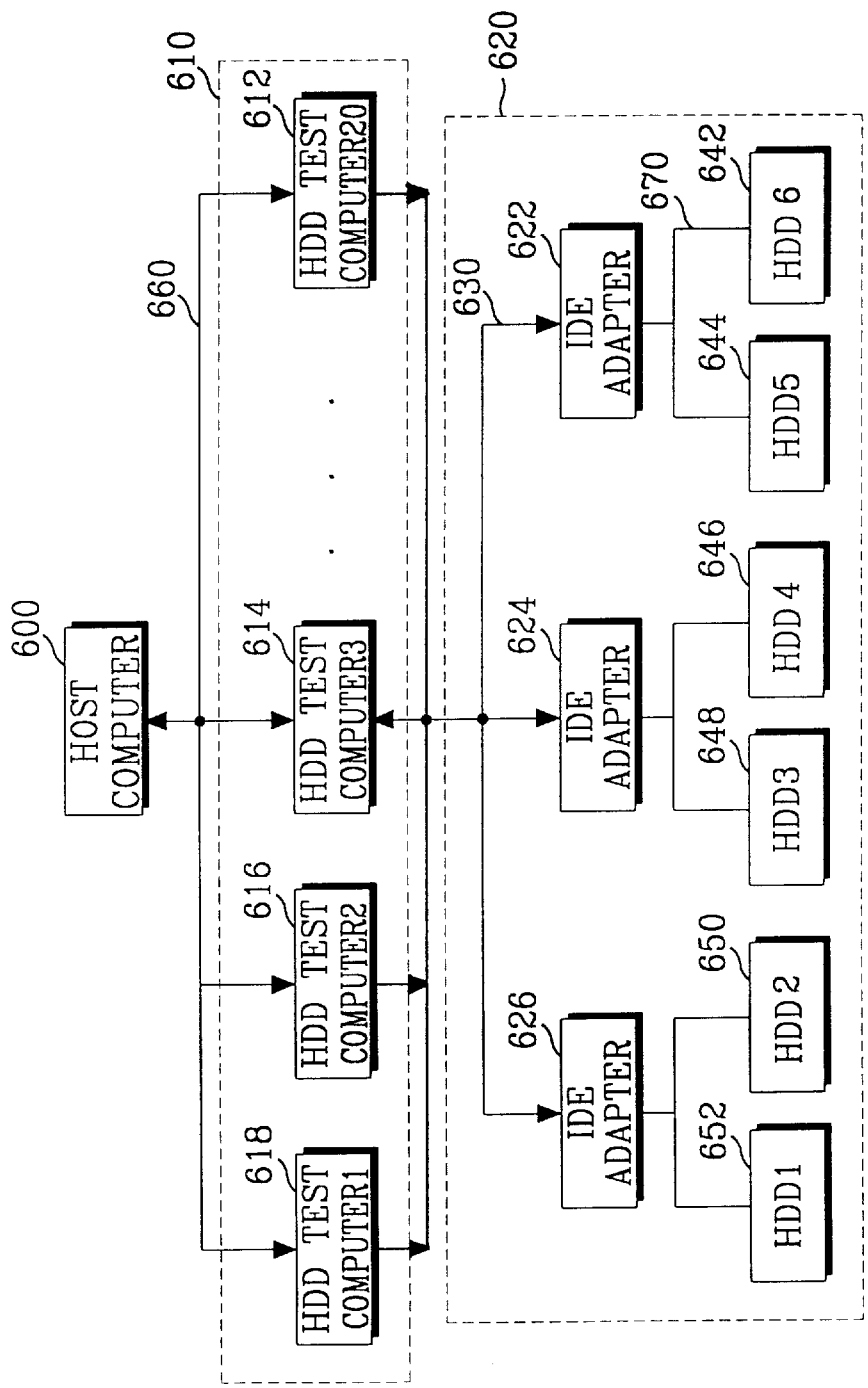
FIG. 6 is a constitutional block diagram of a HDD test system constructed according to the preferred embodiment of the present invention.

Referring to FIG. 6, the host computer 600 is connected by means of first control bus 660 with a sub-computer consisting of twenty HDD test computers 612–618, each of which is in turn connected through second control bus 630 to three dual-channel IDE adapters 622, 624, 626. The IDE adapters 622, 624, 626 each are connected with two HDDs 642–652 respectively. The collision detection of data transmissions between the HDD test computers 612–618 is controlled by the host computer 600, and the collision detection of data transmissions between three dual-channel IDE adapters 622, 624, 626 is controlled by the corresponding HDD test computers 612–618.

Therefore, the host computer 600 receives data of the test results through first control bus is 660 from HDD test computers 612–618, and controls the temperature of both chambers 30, 40. The HDD test computers 612–618 are booted upon receipt of the booting program by means of first control bus 660 from the host computer 600 in order to control the IDE adapters 622, 624, 626 to output test instructions for the HDDs, and execute the inner device driver program (not shown) to execute instructions and transfer informations for the testing HDDs. The IDE adapters 622, 624, 626 are bus master elements to perform data transfer operations independently of the control of the internal CPU. Accordingly, the data transfer between the HDD 642–652 test computer 612–618 and the HDDs to be tested can be performed at high speed.

Figure 7:
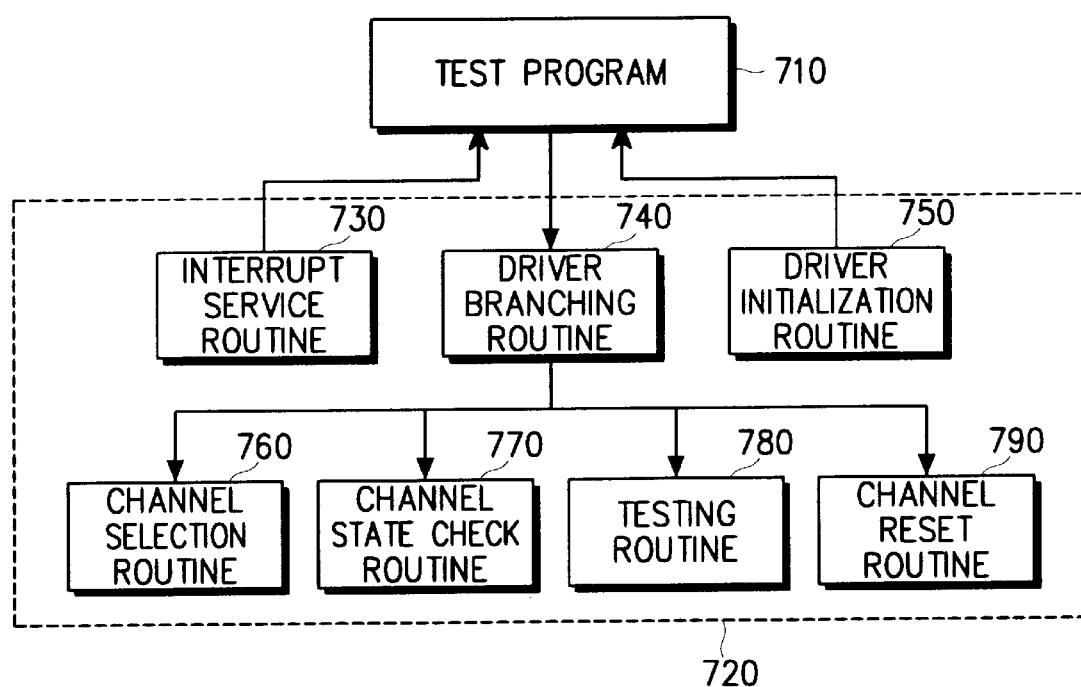
FIG. 7 is a descriptive block diagram of internal device drivers within the HDD test computers according to the preferred embodiment of the present invention.

FIG. 7 illustrates internal device drivers within the HDD test computers according to the preferred embodiment of the present invention. The internal device driver program which exists within the HDD test computer 612–618 serve to execute instructions and transfer information between the HDD test computer and the HDDs to be tested.

Referring to FIG. 7, the internal device drive program consists of seven constituent routines, i.e., an interrupt service routine 730, a driver branching routine 740, a driver initialization routine 750, a channel selection routine 760, a channel state check routine 770, a testing routine 780, and a channel reset routine 790. These routines are stored in the HDD of the host computer 600 and transferred to the memories of the HDD test computers 50 when initializing the test program, and are executed by the HDD test computers 50.

Accordingly, the driver initialization routine 750 initializes the drivers under the control of the CPU within the HDD test computer 50. After the interrupt service routine 730 receives an interrupt output from any one of the channels CH1–CH6 corresponding to respective three IDE adapters 622, 624, 626, the interrupt service routine 730 is executed by the CPU of the HDD test computer 50. The driver branching routine 740 branches the test instructions transferred from the memory of the HDD test computer 50 so as to transfer the corresponding instructions to the lower execution modules such as the channel selection routine 760, the channel state check routine 770, the testing routine 780, and the channel reset routine 790, respectively.

The lower execution routine, i.e. the channel selection routine 760, checks the HDD test computer 50 when executing the driver initialization routine 750 to inform the driver initialization routine 750 of the channel numbers of the mounted IDE adapters 622, 624, 626. Also, the channel state check routine 770 checks the state of the channel selected by the channel selection routine 760. The testing routine 780 is a module transferring the actual test instruction to any channel selected by the channel selection routine 760. Lastly, the channel reset module 790 is a routine for resetting the erroneous channel. Consequently, the device driver serves as a mediator roll for executing instructions and transferring information between the HDD test computer 50 and the HDDs 60 to be tested.

Figure 8:
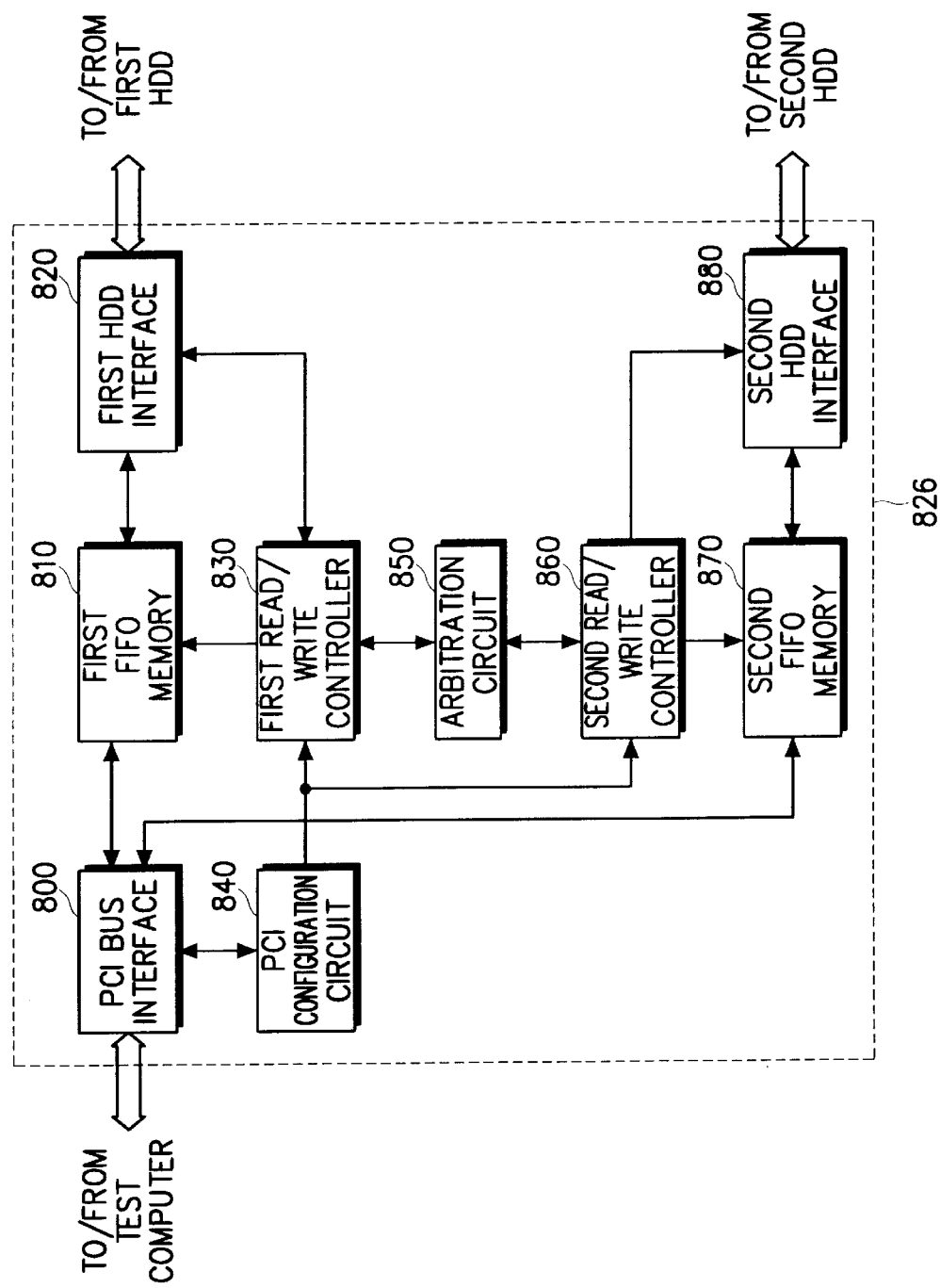
FIG. 8 is a descriptive block diagram of a PCI (peripheral Component Interconnect) IDE (Integrated Drive Electronics) bus master controller within the IDE adapter according to the preferred embodiment of the present invention.

FIG. 8 illustrates a PCI (Peripheral Component Interconnect) IDE (Integrated Drive Electronics) bus master controller within the IDE adapter constructed according to the principles of the present invention. The PCI IDE bus master controller 826 within the IDE adapter consists of first and second read/write controllers 830, 860, a PCI bus interface 800, a PCI configuration circuit 840, first and second FIFO memories 810, 870, an arbitration circuit 850, and HDD interfaces 820, 880.

The PCI bus interface 800 performs an interfacing function of the PCI bus connecting between each of the HDD test computers 612–618 and the IDE adapter 626 in order to send and receive the selected transmission data corresponding to its own address. The PCI configuration circuit 840 initializes the internal configuration of the IDE adapter 626 at first when the HDD test computer 50 loads the device driver 720 to execute the test program. The first and second FIFO memories 810, 870 each are intended for the HDDs 60 to be tested. The first and second FIFO memories 810, 870 serve as memories for compensating for the processing speed difference between the HDD test computers 612–618 and the HDDS being tested. The first and second read/write controller 830, 860 each are intended for the HDDs to be tested, respectively, and the initial configuration of the read/write controllers 830, 860 is set by the PCI configuration part 840. The first and second read/write controller 830, 860 control the first and second FIFO memories 810, 870 and check the state of the first and second HDD interface 820, 880. The first and second HDD interfaces 820, 880 perform an interfacing function through the bus between the IDE adapter 626 and the HDDs to be tested under the control of the first and second read/write controller 830, 860. The first and second HDD interfaces 820, 880 transfer the test instruction from the HDD test computers 612–618 to the HDDs to be tested, and the test results to the first and second FIFO memories 810, 870. Lastly, the arbitration circuit 850 determines the priority of the first or second read/write controller 830, 860 in order to prevent the collision of data sent/received to and from the first and second interfaces 820, 880.

Consequently, by designing IDE adapters having the same structure and operation as described above, the IDE adapters can perform the above data transfer operation independently of the control of the internal CPU of the HDD test computer 612–618. Accordingly, the data transfer between the HDD test computer 612–618 and the HDDs to be tested can be performed at high speed.

The test control program of the HDD test system as shown in FIG. 9 will be now described in detail with reference to FIGS. 6–8.

Figure 9A:
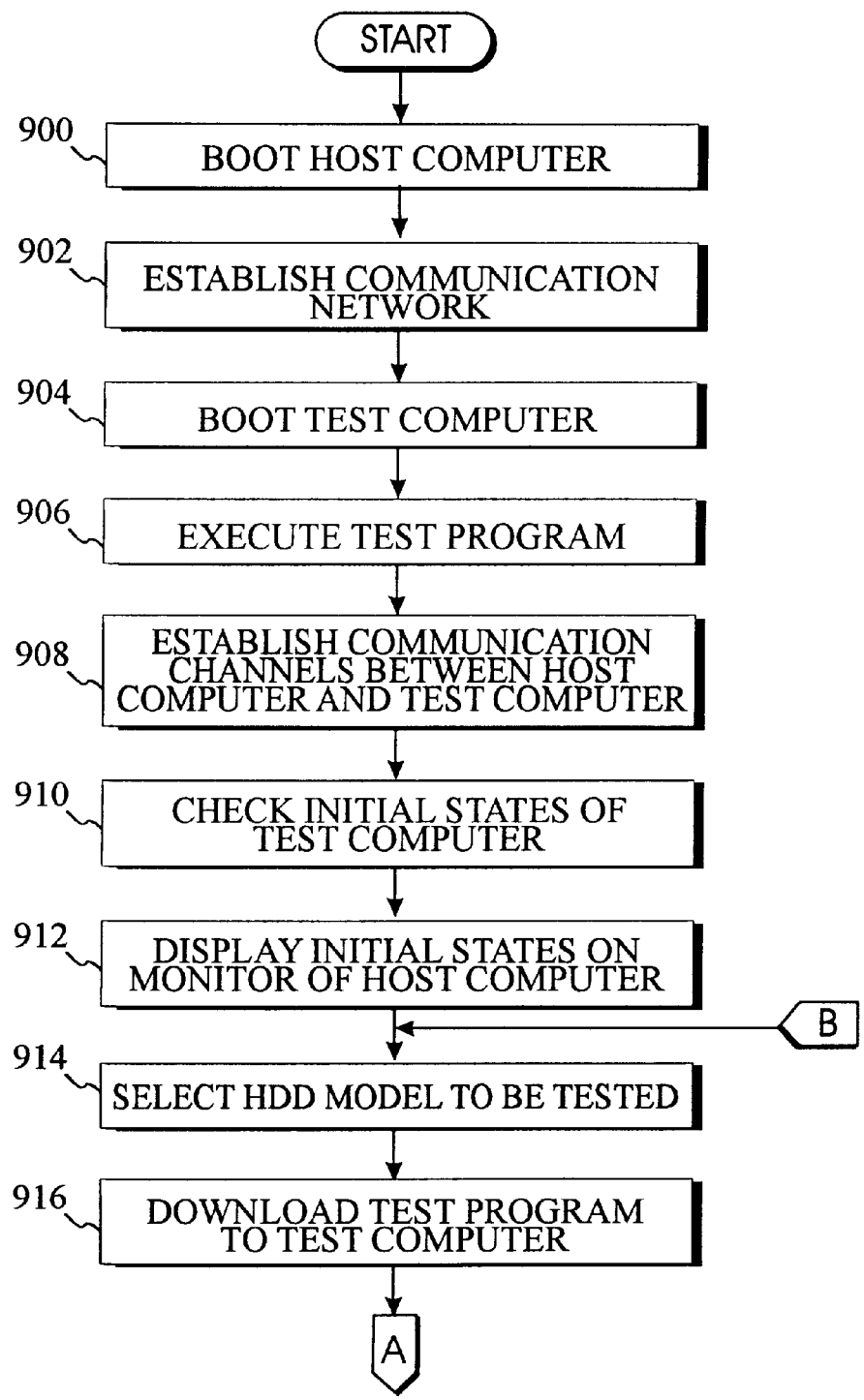
FIGS. 9A and 9B illustrate a control flow chart of a host computer for testing a plurality of HDDs according to the principles of the present invention.
Figure 9B:
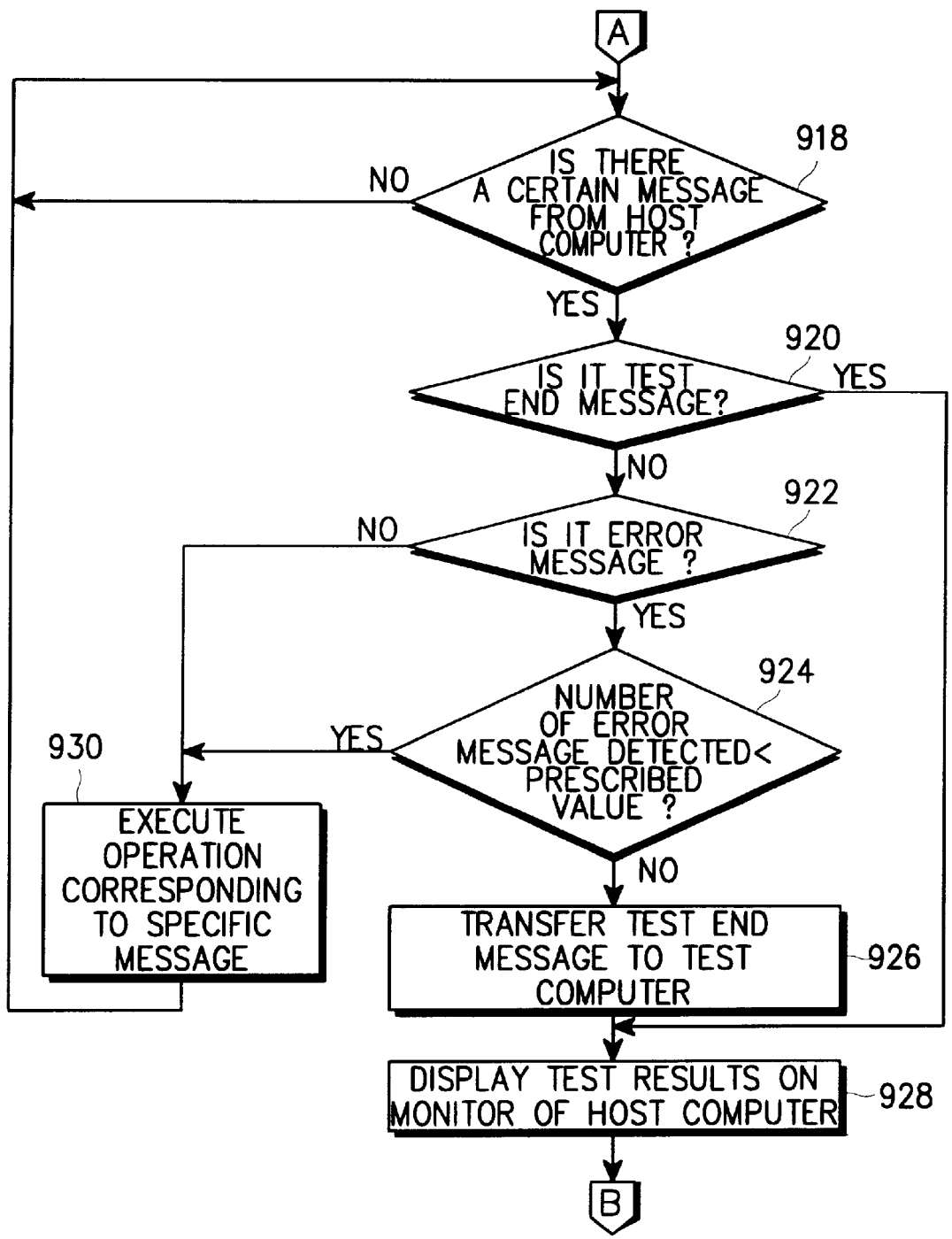

Referring to FIGS. 9A and 9B, the host computer 600 is booted at step 900, and the communication network is established between the host computer 600 and HDD test computers 50 at step 902. Thereafter, the host computer 600 boots up twenty HDD test computers 612–618 at step 904 and executes its own host program at step 906. The host computer 600 then establishes communication channels with each of twenty HDD test computers 612–618, respectively, at step 908 and checks the initial state of each of the HDD test computers 612–618, i.e. the booting state and the loading state of the internal device drivers of each of the HDD test computers 612–618, and the operating state of three IDE adapters 622, 624, 626 at step 910.

After the initial states of the test computers 50 are checked, the host computer 600 displays the checked initial status on the monitor 210 at step 912, and has the operator select the model of the HDDs 60 to be tested at step 914. In step 916, the host computer 600 downloads test programs to the HDD test computers 612–618, respectively. In steps 918–920, the host computer 600 checks any specific message from the HDD test computers 612–618, and when detecting any specific message in step 920, checks whether it is the test end message. At this time, when detecting the test end message, the host computer 600 proceeds to step 928 to display the subsequent test results transferred from the HDD test computers 612–618 on the monitor 210.

In steps 918–920, when detecting any specific message other than the test end message transferred from the HDD test computers 612–618, the host computer 600 checks whether it is an error message at step 922. At this time, when detecting error message, the host computer 600 checks and compares the number of error messages detected with the preset threshold value at step 924. If the number of error messages is not less than the preset threshold value, the host computer 600 performs steps 926–928.

However, if the specific message detected at step 922 is not an error message, or when checking in step 924, if the number of error message is less than the preset threshold value, the host computer 600 returns to step 918 after executing the operation corresponding to the specific message at step 930, and then repeats steps 918 and the subsequent steps again.

Figure 10A:
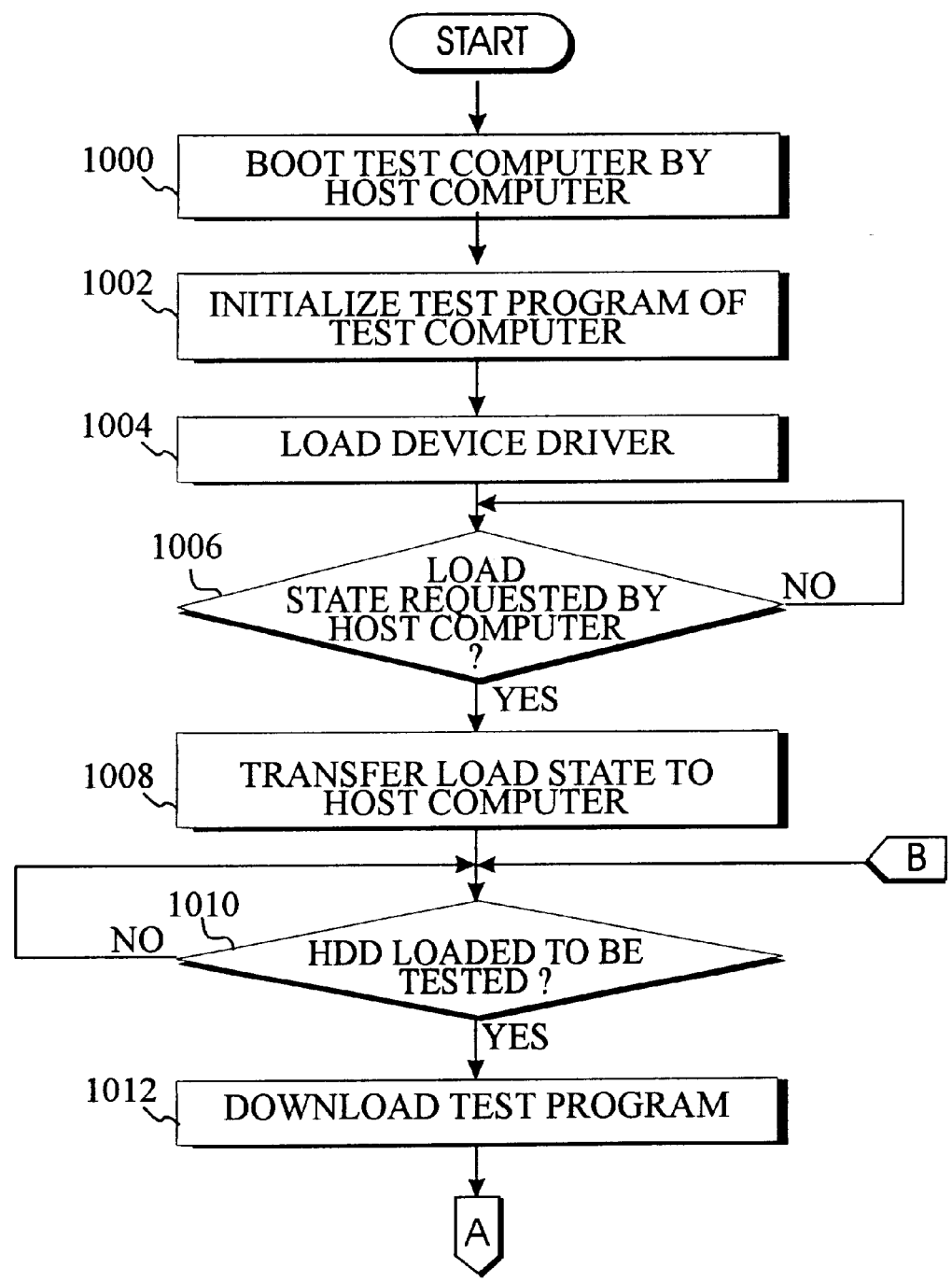
FIGS. 10A and 10B illustrate a control flow chart of a plurality of the HDD test computers for testing a plurality of HDDs according to the principles of the present invention.
Figure 10B:
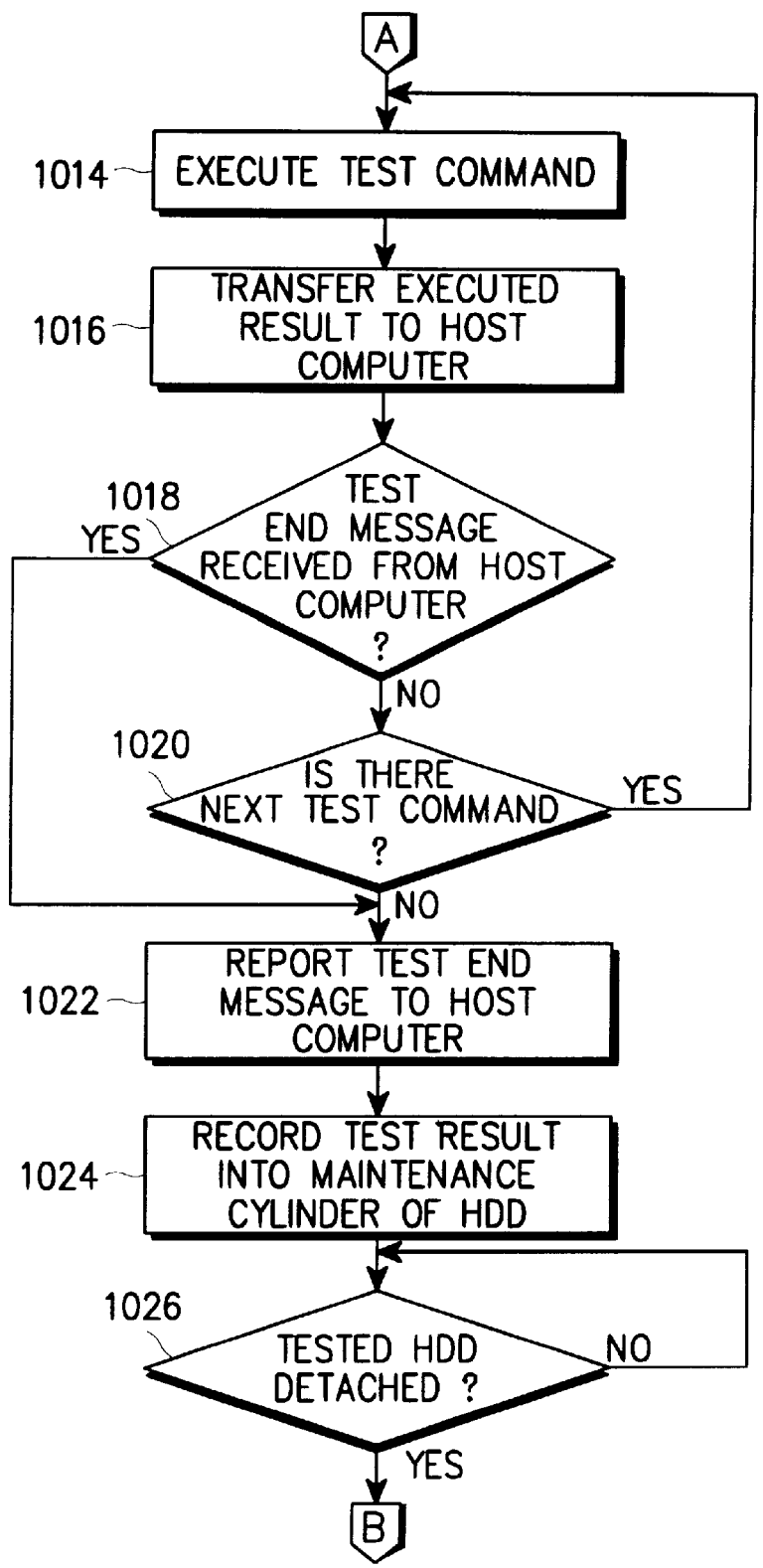

Referring to FIGS. 10A and 10B, the control flow chart concerned is intended for any one of the HDD test computers 612–618 because they follow the same control flow.

In steps 1000–1002, the host computer 600 boots up the HDD test computer 50 and initializes the test program stored in the internal memory 710 as shown in FIG. 7 of the HDD test computer 50. Thereafter, in step 1004, the HDD test computer 50 loads device drivers, i.e., the interrupt service routine 730, the driver branching routine 740, and the driver initialization routine 750. Then, in steps 1006–1008, the HDD test computer 50 transfers the current loading state of its own device drivers in response to the state checking request from the host computer 600. In step 1010, the HDD test computer executes the actual HDD test mode and checks whether the test channels CH1–CH6 each are loaded with respective HDDs to be tested. In step 1012, when the test channels CH1–CH6 are loaded with HDDs, the HDD test computer downloads the test program stored in the internal HDD of the host computer 600. In steps 1014–1016, the HDD test computer 50 executes the channel selection routine 760, the channel state check routine 770, the testing routine 780, and the channel reset routine 790 inside of the device driver 710, and then transfers the test result data to the host computer 600. At this time, the HDD test computer 50 checks the state of the selected channel by means of the channel state check routine 770 and then selects one of the instruction codes within the testing routine 780 to execute the selected code. Accordingly, the instruction code to be executed is transferred through three IDE adapters 622, 624, 626 to the HDD to be tested under the control of the internal device driver of the HDD test computer 50.

Thereafter in step 1018, the HDD test computer 50 checks whether the test end message is received from the host computer 600. Upon detection of the test end message, in step 1022–1024, the HDD test computer 50 reports that detection to the host computer and records the test result on the maintenance cylinder (storage area) of the tested HDD. Finally in step 1026, the HDD test computer 50 checks whether the tested HDD is detached and returns to step 1010 after ascertaining that the tested HDD is detached, thereby repeating the testing steps when another HDD is loaded.

At step 1018, when missing the test end message from the host computer 600, the HDD test computer 50 proceeds to step 1020 in order to determine whether there is another instruction code within the testing routine 780 and, if there is, then return to step 1014 to repeat subsequent steps therefrom. However, in step 1020, if there is not another instruction code to be selected for execution, the HDD test computer 50 proceeds to step 1022 to transfer the test termination message to the host computer 600 and then performs steps 1024–1026.

In conclusion, in the HDD test system of the present invention, a host computer 600 can accommodate twenty HDD test computers 612–618, each of which in turn is connected with three IDE adapters 222, 224, 226, and each of three IDE adapters 222, 224, 226 is further connected with two HDDs for testing, so that a single host computer 600 can test 120 (hundred twenty) HDDs simultaneously. Accordingly, the HDD testing capacity of the present invention is greatly improved in comparison with the contemporary practice.

As described above, the present invention has the advantages that the test efficiency of the HDD test process can be considerably enhanced, and a number of hard disk drives can be simultaneously tested in a minimum space and time, and accordingly, the present invention can provide a highly reliable and efficient HDD test system with a low manufacturing cost. Further, the burn-in chamber and the control chamber are integrally constructed, so that the stability of the system is improved.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A system for multi-testing a number of disk drives, comprising:
   a burn-in chamber of a predetermined temperature for orderly stacking said disk drives in rows and columns;
   a control chamber thermally insulated from said burn-in chamber by a partition wall for detachably mounting a plurality of disk drive test computers in rows and columns, each test computer including means for electrically said each test computer to a corresponding plurality of said disk drives so as to test said plurality of said disk drives; and
   a host computer including a monitor for controlling an internal environment of said burn-in chamber and operation of said disk drive test computers.

2. The system of claim 1, wherein each of said connecting means includes test connectors for electrically connecting with said plurality of disk drives by means of corresponding intermediate connectors, said partition wall having a plurality of slots for connecting said burn-in chamber with said control chamber to accommodate electrical connection between said test connectors and said intermediate connectors.

3. The system of claim 1, wherein said partition wall has a plurality of guide pins extending toward said control chamber, said test computer having corresponding guide holes on a side facing said guide pins so that said test computer is correctly positioned against said partition wall when said guide pins are positioned in said guide holes.

4. A system for multi-testing a number of disk drives, comprising:
   a host computer for controlling testing of selected ones of said disk drives in response to a command of an operator;
   a plurality of disk drive test computers, each including means for testing a corresponding plurality of said disk drives and for transferring test results to said host computer under control of said host computer; and
   a plurality of adapters connected to each of said disk drive test computers to control data transfer between said disk drives and said disk drive test computers.

5. In a system for testing a number of disk drives which includes a host computer, a plurality of disk drive test computers connected with said host computer, and a plurality of adapters connected to each of said disk drive test computers, a plurality of said disk drives being connected with each of said connectors, a method for multi-testing said disk drives comprising the steps of:
   inputting a multi-test command from said host computer;
   providing a test control signal to said disk drive test computers in response to input of said multi-test command from said host computer;
   downloading a test program from said host computer to a designated disk drive test computer to test a plurality of disk drives through said adapters;
   transferring test results through said adapters to said designated disk drive test computer; and
   finally reporting said test results to said host computer.

6. The method of claim 5, wherein said step of inputting said multi-test command comprises:
   booting said disk drive test computers according to a program executed by said host computer; and
   checking initial states of said disk drive test computers to generate said test control signal.

7. The method of claim 6, further comprising the steps of detecting a test end message from said host computer after finally reporting said test results, and writing the tested results into maintenance cylinders of the tested disk drives.

8. The system of claim 4, wherein said testing means comprises a plurality of connectors each of said connectors being connected to a respective one of said plurality of disk drives.

9. The system of claim 8, further comprising a plurality of mounting jigs for holding said plurality of disk drives.

10. The system of claim 9, further comprising a partition wall separating said plurality of disk drive test computers from said plurality of disk drives, said partition wall having a plurality of slots formed therein for allowing said plurality of connectors to be connected to said plurality of disk drives.

11. The system of claim 8, further comprising a partition wall separating said plurality of disk drive test computers from said plurality of disk drives, said partition wall having a plurality of slots formed therein for allowing said plurality of connectors to be connected to said plurality of disk drives.

12. A system for multi-testing a plurality of disk drives, comprising:
   a plurality of disk drive test computers, each including means for testing a corresponding plurality of said disk drive;
   a plurality of mounting jigs, one for each of said disk drives, for holding said disk drives; and
   intermediate connector means, one for each of said mounting jigs, disposed on a side of said mounting jigs facing said plurality of disk drive test computers for electrically connecting said plurality of disk drives and said plurality of disk drive test computers.

13. The system of claim 12, further comprising a partition wall disposed between said mounting jigs and said plurality of disk drives, on the one hand, and said plurality of disk drive test computers, on the other hand, said partition wall having a plurality of slots formed therein so as to permit electrical connection of said intermediate connector means to said plurality of disk drive test computers.

14. The system of claim 13, wherein said partition wall includes at least one guide pin, and wherein said plurality of disk drive test computers includes at least one guide hole so that said plurality of disk drive test computers is correctly positioned against said partition wall when said at least one guide pin is positioned in said at least one guide hole.

15. The system of claim 12, wherein each of said plurality of mounting jigs includes at least one pogo pin electrically connected to said intermediate connector means.

16. A system for multi-testing a plurality of disk drives, comprising:
   at least one disk drive test computer, including means for testing a corresponding plurality of said disk drives; and
   integrated drive electronics (IDE) adapter means for electrically connecting said testing means of said at least one disk drive test computer and said corresponding plurality of disk drives;
   wherein said IDE adapter means comprises:
      a peripheral component interconnect (PCI) bus interface connected to said testing means;

a plurality of memories, one for each of said corresponding plurality of disk drives, connected to said PCI bus interface; and a plurality of disk drive interfaces, one for each of said corresponding plurality of disk drives, connected between said plurality of memories and said corresponding plurality of disk drives.

17. The system of claim 16, said IDE adapter means further comprising a PCI configuration circuit connected to said PCI bus interface.

18. The system of claim 17, said IDE adapter means further comprising a plurality of read/write controllers, one for each of said plurality of memories, connected between said PCI configuration circuit and said plurality of memories.

19. The system of claim 18, said IDE adapter means further comprising an arbitration circuit connected to each of said plurality of read/write controllers.

20. The system of claim 16, said IDE adapter means further comprising a plurality of read/write controllers, one for each of said plurality of memories, for controlling read and write operations of said plurality of memories.

21. The system of claim 20, said IDE adapter means further comprising an arbitration circuit connected to each of said plurality of read/write controllers.

22. A method for multi-testing a plurality of disk drives using a plurality of disk drive test computers, each of said disk drive test computers being connected to and testing a corresponding plurality of said disk drives, each of said plurality of disk drive test computers being connected to a host computer which controls operation of said plurality of disk drive test computers, said method comprising steps of:

booting the host computer;

booting each of the disk drive test computers;

executing a test program;

establishing communication channels between host computer and each of the disk drive test computers;

checking initial states of each of the disk drive test computers;

selecting a disk drive model to be tested; and downloading a test program to each of the disk drive test computers from the host computer.

23. A method for multi-testing a plurality of disk drives using a plurality of disk drive test computers connected to a host computer, each of said disk drive test computers being connected to and testing a corresponding plurality of said disk drives, said method comprising the steps of:

booting the host computer and each of said plurality of disk drive test computers;

executing a test program;

determining whether there is a certain message from the host computer;

when there is a certain message from the host computer, determining whether the certain message is a test end message; and when the certain message is a test end message, displaying test results on a monitor of the host computer.

24. The method of claim 23, further comprising the steps of:

when the certain message is not a test end message, determining whether the certain message is an error message; and when the certain message is not an error message, executing an operation corresponding to the certain message, and then returning to the step of determining whether there is a certain message from the host computer.

25. The method of claim 23, further comprising the steps of:

when the certain message is not a test end message, determining whether the certain message is an error message;

when the certain message is an error message, determining whether the number of error messages detected is less than predetermined value; and when the number of error messages detected is less than the predetermined value, executing an operation corresponding to a specific message, and then returning to the step of determining whether there is a certain message from the host computer.

26. The method of claim 25, further comprising the steps of:

when the number of error messages detected is not less than the predetermined value, transferring a test end message to at least one of said disk drive test computers, and then displaying test results on a monitor of the host computer.

27. A method for a multi-testing a plurality disk drives using a plurality of disk drive test computers connected to a host computer, each of said plurality of disk drive test computers being connected to and testing a corresponding plurality of said disk drives, said method comprising the steps of:

using the host computer to boot each of said plurality of disk drive test computers;

initializing a test program for each of said plurality of disk drive test computers;

determining whether a load state is requested by the host computer;

when the loads state is requested by the host computer, transferring the load state to the host computer;

determining whether disk drives are loaded to be tested; and when there are disk drive loaded to be tested, downloading the test program.

28. The method of claim 27, further comprising the steps of:

executing a test command;

transferring an executed result to the host computer;

determining whether a test end message is received from the host computer; and when the test end message is received from the host computer, recording a test result into a maintenance cylinder of a corresponding one of the disk drives.

29. The method of claim 28, further comprising the steps of:

when the test end message is not received from the host computer, determining whether there is next command;

when there is a next command, returning to the step of executing the test command; and when there is not a next command, recording a test result in a maintenance cylinder of a corresponding one of the disk drives.

30. The method of claim 29, further comprising the steps of:

determining whether a tested disk drive is detached; and when the tested disk drive is detached, returning to the step of determining whether a disk drive is loaded to be tested.

31. The system of claim 1, wherein said connecting means comprises a plurality of integrated drive electronics (IDE) adapters.

32. The system of claim 31, wherein each said IDE adapter comprises:
- a peripheral component interconnect (PCI) bus interface connected to said testing means;
- a plurality of memories, one for each of said corresponding plurality of disk drives, connected to said PCI bus interface; and
- a plurality of disk drive interfaces, one for each of said corresponding plurality of disk drives, connected between said plurality of memories and said corresponding plurality of disk drives.

33. The system of claim 32, wherein each said IDE adapter further comprises a PCI configuration circuit connected to said PCI bus interface.

34. The system of claim 33, wherein each said IDE adapter further comprises a plurality of read/write controllers, one for each of said plurality of memories, connected between said PCI configuration circuit and said plurality of memories.

35. The system of claim 34, wherein each said IDE adapter further comprises an arbitration circuit connected to each of said plurality of read/write controllers.

36. The system of claim 32, wherein each said IDE adapter further comprises a plurality of read/write controllers, one for each of said plurality of memories, for controlling read and write operations of said plurality of memories.

37. The system of claim 36, wherein each said IDE adapter further comprises an arbitration circuit connected to each of said plurality of read/write controllers.

38. The system of claim 4, wherein each said adapter comprises:
- a peripheral component interconnect (PCI) bus interface connected to said testing means;
- a plurality of memories, one for each of said corresponding plurality of disk drives, connected to said PCI bus interface; and
- a plurality of disk drive interfaces, one for each of said corresponding plurality of disk drives, connected between said plurality of memories and said corresponding plurality of disk drives.

39. The system of claim 38, wherein each said adapter further comprises a PCI configuration circuit connected to said PCI bus interface.

40. The system of claim 39, wherein each said adapter further comprises a plurality of read/write controllers, one for each of said plurality of memories, connected between said PCI configuration circuit and said plurality of memories.

41. The system of claim 40, wherein each said adapter further comprises an arbitration circuit connected to each of said plurality of read/write controllers.

42. The system of claim 38, wherein each said adapter further comprises a plurality of read/write controllers, one for each of said plurality of memories, for controlling read and write operations of said plurality of memories.

43. The system of claim 42, wherein each said adapter further comprises an arbitration circuit connected to each of said plurality of read/write controllers.

44. The system of claim 5, wherein each said adapter comprises:
- a peripheral component interconnect (PCI) bus interface connected to said testing means;
- a plurality of memories, one for each of said corresponding plurality of disk drives, connected to said PCI bus interface; and
- a plurality of disk drive interfaces, one for each of said corresponding plurality of disk drives, connected between said plurality of memories and said corresponding plurality of disk drives.

45. The system of claim 44, wherein each said adapter further comprises a PCI configuration circuit connected to said PCI bus interface.

46. The system of claim 45, wherein each said adapter further comprises a plurality of read/write controllers, one for each of said plurality of memories, connected between said PCI configuration circuit and said plurality of memories.

47. The system of claim 46, wherein each said adapter further comprises an arbitration circuit connected to each of said plurality of read/write controllers.

48. The system of claim 44, wherein each said adapter further comprises a plurality of read/write controllers, one for each of said plurality of memories, for controlling read and write operations of said plurality of memories.

49. The system of claim 48, wherein each said adapter further comprises an arbitration circuit connected to each of said plurality of read/write controllers.

50. The system of claim 12, wherein said intermediate connector means comprises a plurality of integrated drive electronics (IDE) adapters.

51. The system of claim 50, wherein each said IDE adapter comprises:
- a peripheral component interconnect (PCI) bus interface connected to said testing means;
- a plurality of memories, one for each of said corresponding plurality of disk drives, connected to said PCI bus interface; and
- a plurality of disk drive interfaces, one for each of said corresponding plurality of disk drives, connected between said plurality of memories and said corresponding plurality of disk drives.

52. The system of claim 51, wherein each said IDE adapter further comprises a PCI configuration circuit connected to said PCI bus interface.

53. The system of claim 52, wherein each said IDE adapter further comprises a plurality of read/write controllers, one for each of said plurality of memories, connected between said PCI configuration circuit and said plurality of memories.

54. The system of claim 53, wherein each said IDE adapter further comprises an arbitration circuit connected to each of said plurality of read/write controllers.

55. The system of claim 51, wherein each said IDE adapter further comprises a plurality of read/write controllers, one for each of said plurality of memories, for controlling read and write operations of said plurality of memories.

56. The system of claim 55, wherein each said IDE adapter further comprises an arbitration circuit connected to each of said plurality of read/write controllers.

57. A system for multi-testing a plurality of disk drives, comprising:
- at least one disk drive test computer including means for testing a corresponding plurality of said disk drives: and
- integrated drive electronics (IDE) adapter means for electrically connecting said testing means of said at least one disk drive test computer and said corresponding plurality of disk drives;
- said system further comprising a plurality of mounting jigs, one for each of said disk drives, for holding said disk drives.

58. The system of claim 57, further comprising intermediate connector means disposed on a side of said mounting jigs facing said at least one disk drive test computer for electrically connecting said plurality of disk drives and said at least one disk drive test computer.

59. The system of claim 58, further comprising a partition wall disposed between said mounting jigs and said plurality of disk drives, on the one hand, and said at least one disk drive test computer, on the other hand, said partition wall having a plurality of slots formed therein so as to permit electrical connection of said intermediate connector means to said at least one disk drive test computer.

60. The system of claim 59, wherein said partition wall includes at least one guide pin, and wherein said at least one disk drive test computer includes at least one guide hole so that said at least one disk drive test computer is correctly positioned against said partition wall when said at least one guide pin is positioned in said at least one guide hole.

61. The system of claim 58, wherein each of said mounting jigs includes at least one pogo pin electrically connected to said intermediate connector means.

62. A system for multi-testing a plurality of disk drives, comprising:

at least one disk drive test computer, including means for testing a corresponding plurality of said disk drives; and integrated drive electronics (IDE) adapter means for electrically connecting said testing means of said at least one disk drive test computer and said corresponding plurality of disk drives;

said system further comprising a burn-in chamber of a predetermined temperature for stacking said disk drives in rows and columns.

63. The system of claim 62, further comprising a control chamber for detachably mounting said at least one disk drive test computer, and a partition wall for thermally insulating said control chamber from said burn-in chamber.

64. The system of claim 63, said partition wall having a plurality of slots formed therein for facilitating electrical connection of said at least one disk drive test computer to said corresponding plurality of disk drives by said IDE adapter means.

65. The system of claim 62, further comprising a host computer including a monitor for controlling an internal environment of said burn-in chamber and operation of said at least one disk drive test computer.

* * * * *